(12) United States Patent
Billiet et al.

(10) Patent No.: US 7,083,757 B2
(45) Date of Patent: Aug. 1, 2006

(54) METHOD OF MAKING SEMICONDUCTOR BONDING TOOLS

(76) Inventors: Romain L. Billiet, 135A Malacca Street, Penang (MY) 10400; Hanh T. Nguyen, 135A Malacca Street, Penang (MY) 10400

( * ) Notice: Subject to any disclaimer, the term of this patent is extended or adjusted under 35 U.S.C. 154(b) by 365 days.

(21) Appl. No.: 10/082,867

(22) Filed: Feb. 18, 2002

(65) Prior Publication Data

US 2002/0158374 A1    Oct. 31, 2002

Related U.S. Application Data

(60) Provisional application No. 60/273,175, filed on Feb. 28, 2001.

(51) Int. Cl.
 C04B 35/64    (2006.01)
 B23K 35/00    (2006.01)
(52) U.S. Cl. .................. 264/610; 264/614; 264/628
(58) Field of Classification Search ............... 264/669, 264/670, 614, 629, 610, 628
See application file for complete search history.

(56) References Cited

U.S. PATENT DOCUMENTS

| | | | |
|---|---|---|---|
| 4,049,506 A * | 9/1977 | Gilding | .............. 205/50 |
| 4,667,867 A | 5/1987 | Dobbs et al. | |
| 5,217,154 A | 6/1993 | Elwood et al. | |
| 5,421,503 A * | 6/1995 | Perlberg et al. | .............. 228/4.5 |
| 5,485,949 A * | 1/1996 | Tomura et al. | .......... 228/180.5 |
| 5,558,270 A * | 9/1996 | Nachon et al. | .......... 228/180.5 |
| 5,741,842 A * | 4/1998 | Huggins et al. | ............ 524/500 |
| 5,890,643 A * | 4/1999 | Razon et al. | ............... 228/1.1 |
| 6,073,827 A * | 6/2000 | Razon et al. | ............... 228/4.5 |
| 6,080,445 A * | 6/2000 | Sugiyama et al. | ....... 427/249.7 |
| 6,171,456 B1 | 1/2001 | Hadar et al. | |
| 6,321,969 B1 * | 11/2001 | Miller | ...................... 228/4.5 |
| 6,354,479 B1 * | 3/2002 | Reiber et al. | ................ 228/4.5 |
| 6,409,463 B1 * | 6/2002 | Croft et al. | ................ 414/754 |
| 6,651,864 B1 * | 11/2003 | Reiber et al. | ................ 228/4.5 |
| 2002/0158374 A1 * | 10/2002 | Billiet et al. | ................ 264/669 |

OTHER PUBLICATIONS

Reed, Principles of Ceramics Processing, 1995, John Wiley & Sons, Second Edition, p. 583.*

* cited by examiner

*Primary Examiner*—Carlos Lopez

(57) ABSTRACT

Semiconductor wire bonding tools used in the assembly and interconnection of integrated circuits (ICs) are micromolded from a mixture of ultrafine particulate materials mixed with an organic binder. Following extraction of the binder the green bonding tools are sintered during which they undergo isotropic, constant and accurately predetermined shrinkage. Hence semiconductor wire bonding tools can be produced with virtually no limit to miniaturization, thus allowing the fabrication of higher integrated semiconductor products.

15 Claims, 2 Drawing Sheets

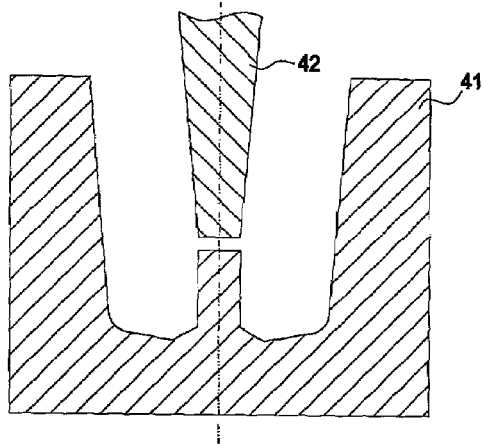
Fig. 4
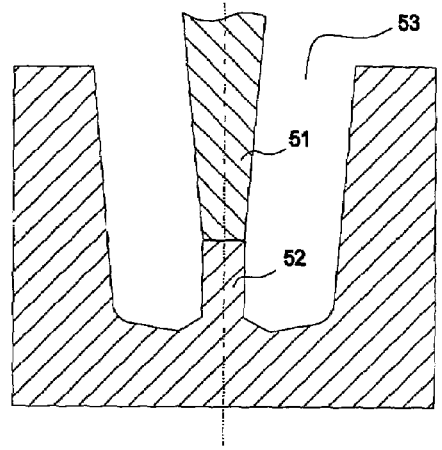
Fig. 5
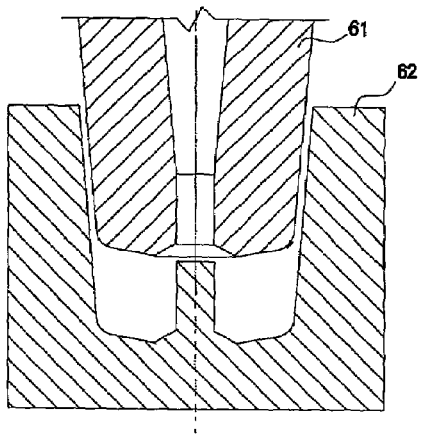
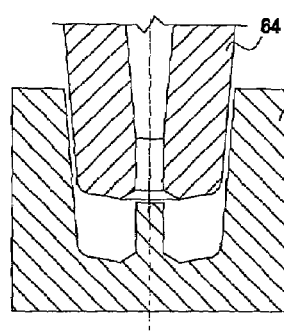
Fig. 6
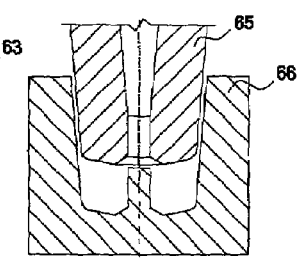

METHOD OF MAKING SEMICONDUCTOR BONDING TOOLS

CROSS-REFERENCE TO RELATED APPLICATIONS

This application claims priority to U.S. Provisional Patent Application Ser. No. 60/273,175 filed on Feb. 28, 2001.

This invention is related to co-pending U.S. patent application Ser. No. 09/962,526 filed on Sep. 20, 2001 entitled: 'Method For Controlling The Dimensions Of Bodies Made From Sinterable Materials' and co-pending U.S. patent application Ser. No. 09/976,393 filed on Oct. 8, 2001 entitled: 'Method For Making Micromolds'.

REFERENCES CITED

U.S. Patent Documents

REFERENCES CITED

| U.S. Patent Documents | | | |
|---|---|---|---|
| 2,939,199 | September 1960 | Strivens | 264/63 |
| 4,197,118 | April 1980 | Wiech | 264/63 |
| 4,405,074 | September 1983 | Levintov, et al. | 228/41 |
| 4,513,190 | April 1985 | Ellett, et al. | 219/56.21 |
| 4,667,867 | May 1987 | Dobbs, et al. | 228/44.7 |
| 5,217,154 | June 1993 | Elwood, et al. | 228/4.5 |
| 5,421,503 | June 1995 | Perlberg, et al. | 228/4.5 |
| 5,558,270 | September 1996 | Nachon, et al. | 228/180.5 |
| 6,171,456 | January 2001 | Hadar, et al. | 204/192.15 |

STATEMENT REGARDING FEDERALLY SPONSORED RESEARCH OR DEVELOPMENT

Not Applicable.

REFERENCE TO A MICROFICHE APPENDIX

Not Applicable.

BACKGROUND

1. Field of Invention

The present invention relates to the fabrication of tools used in the assembly and interconnection of semiconductor devices and associated structures. More particularly the present invention relates to the fabrication of miniaturized semiconductor wire bonding tools such as ceramic capillaries, tungsten carbide bonding wedges, die-collets, and the like, with reduced dimensions and improved dimensional accuracy well beyond the capability of prior art manufacturing techniques.

2. Description of Prior Art

The universal trend, in the electronics, aerospace, medical and other fields of industry, toward smaller, more complex, lighter, more tightly toleranced, and more highly integrated products to be used in more aggressive, corrosive, hotter or constrained environments, creates a situation which has pushed current manufacturing technologies to their limits of capability.

Nowhere is the need for miniaturization and integration felt more intensely than in the microelectronics industry. For example, the market's craving for lighter, smaller and lower power electronic appliances such as laptop computers, palm-sized Personal Digital Assistants (PDAs), lightweight cellular phones and many other sophisticated electronic gadgets, has driven designers of such products into the so-called 'system-on-a-chip' (SOC), 'chip-scale-package' (CSP) and multilevel package design.

As a result, in the fabrication of integrated circuits (ICs) or semiconductor chips—which pervade every field of life and industry today—there is enormous impetus to increase the functionality of silicon chips, which in turn implies increasing the density of electronic circuits on a single chip. For the past forty years, the number of transistors on a chip has—rather remarkably—followed Moore's Law, which states that the number of transistors on a chip is bound to double every 18 months. In Intel's latest Micro2000 chip, that number already exceeds 10 million.

As silicon technology progresses towards higher integration, there is a corresponding increase in the I/O (input/output) count, also termed lead or wire count, i.e. the number of interconnections between the silicon chip and the external circuitry. The world wide lead count for IC interconnections is expected to surpass 9 trillion by 2003. The current average wire count per IC is approximately 45 while the high end of wire counts is approximately 500 for ASIC devices, graphic chips, and chips that support processors.

As a result, increasing demands are being placed on the interconnect or bond pitch, i.e. the distance between contiguous interconnections. The smaller the bond pitch, the less die (or chip) real estate is taken up by the bond pad, the area on the silicon chip specifically reserved for the interconnection or bond. If bond pads can be reduced in size and brought closer together, the die can be shrunk, resulting in a larger number of dice and significantly higher revenue per wafer. With devices tending towards very high integration, the bond pad pitch has to decrease.

The major bonding process used for semiconductor interconnection, accounting for more than 90 percent of the global bonded lead count, is wire bonding. In the simplest terms, wire bonding is a low temperature welding process whereby a thin conductive wire, of the order of 25 μm in diameter and generally of gold, aluminum, copper or various metal alloys, is connected from the bonding pad on the IC to the corresponding bonding area of the microelectronic package's lead frame.

The process consists of bringing the bonding wire in close proximity with the bond site and applying ultrasonic energy which increases the dislocation density in the area where the wire and bond site are contiguous, resulting in lower flow stress and modulus of elasticity and increased rate of diffusion. As material flow occurs, microscopic slip planes shear across each other, generating new metallurgically clean surfaces which diffusion weld to each other. Higher ultrasonic frequencies increase the strain rate, resulting in a more efficient energy transfer from the wire to the bond interface.

There are currently two wire bonding techniques: ball bonding and wedge bonding. Ball bonding is a high-speed omnidirectional process, performed almost exclusively with gold wire, which lays claim to more than 95 percent of the total wire bonded lead count. Gold ball bonding is usually performed using tiny ceramic tubelets called capillaries.

The first step in the ball bonding cycle consists of paying out a predetermined length of gold wire through the capillary orifice or tip, upon which the end of the protruding wire is melted in an electric arc (electronic flame-off, EFO) to form the so-called free air ball. The capillary then positions the ball onto the IC bond pad while ultrasonic energy is applied, thus generating the first or ball bond. Next, the capillary retracts while bonding wire is paid out through the capillary orifice. The capillary then proceeds toward the corresponding bond site on the lead frame. The motion and path of the capillary are carefully engineered so as to generate a precise wire loop geometry. The second or tail bond is then created, again using ultrasonic energy, upon which the capillary tip sections off the bonding wire after the second bond and the next cycle starts.

Wedge bonding is a similar but lower speed process using aluminum, gold, and sometimes copper wire. No ball is formed in the process. Wedge bonding is capable of finer pitch than ball bonding and is usually performed using wedge shaped tungsten carbide tools called bonding wedges.

Prior art bonding tools have been produced from a variety of materials such as glass, tungsten carbide, titanium carbide, steel alloys, alumina, zirconia, monocrystalline ruby, etc., and with many different geometries. For example, prior art wire bonding tool tips have included circular, V-shaped, square or rectangular tips with concave or flat contact areas doted with parallel or non-parallel grooves, patterns or textured surfaces to promote bonding.

During the bonding process, the bonding tool's tip is subjected to heat, abrasion and stress. Abrasion and tool wear ultimately change the surface texture of the tip, affecting the transfer of ultrasonic energy to the bond interface, while repeated cycling of ultrasonic energy through the bonding tool may result in microcracks, culminating in fatigue-induced fracture.

Hence, prior art efforts have focused on improving the mechanical properties and abrasion resistance of wire bonding tools. For instance Dobbs, et al., U.S. Pat. No. 4,667.867 and Elwood, et al. U.S. Pat. No. 5,217,154 propose equipping bonding tools with tips made from hard materials. Others have proposed hard tip coatings. To obviate the deleterious effects of ultrasonic cycling, other inventors suggest making the bonding tool shank or main body from a stiffer material in order to reduce the amplitude of the displacement caused by the ultrasonic vibration.

Yet, when it comes to solving the problems related to finer bonding pitch and its corollary, smaller bond pads, the prior art has only been marginally successful.

The reason for this is because reducing bond pad area and pitch has a domino effect on the entire technology of IC interconnection. The findamental, complex and interrelated issues to be addressed in ultrafine pitch wire bonding include dimensioning the lead frame, resizing bond pad and pitch on the die, determining bonding wire diameter and length as well as the height and profile of the wire loop, bonding process optimization, bonding tool design and various material properties and reliability issues. These issues constitute today's biggest bottleneck in IC design and assembly and, as I/O count grows, that bottleneck gets bigger.

Whereas, from an IC designer's point of view, the minimum bond pad pitch is what should dictate the capillary tip diameter, and the maximum acceptable loop height should dictate the cone angle—or tip diameter—of the capillary, in reality it is the opposite situation that prevails.

When bond pad pitch started to shrink, the first problem capillary designers had to solve was a purely geometrical one: capillary tips had to clear previously produced bonds and wire loops. A makeshift solution was to grind the tips of standard capillaries to a smaller cone angle, resulting in today's so-called "bottleneck capillaries".

A direct consequence of this geometry is that, since the capillary borehole diameter remains constant, the capillary tip wall thickness, and subsequently its mechanical strength, are considerably weakened, hence bottleneck capillaries are much more fragile. Also it is very difficult to precisely CNC grind the typically 25 µm thin brittle walls of state-of-the-art ceramic bottleneck capillary tips. Automated grinding lines can, at best, achieve machining tolerances of approximately 2.5 µm, which is insufficient when capillary design features are further reduced in size. Furthermore, stresses and microcracks, inevitably introduced during the grinding operation, combined with the thermal and ultrasonic cycling inherent to the bonding process, increase the probability of in-service capillary tip fracture, a dreaded prospect for any semiconductor firm, as bonding is the final step before IC encapsulation. As a result, bottleneck capillaries cost typically 50–100% more than standard capillaries. A partial solution to the weak tip wall problem is to make the capillaries from ZTA (zirconia toughened alumina) but this raises their cost even more.

But it is in attempting to solve the functional problems generated by reduced bond pad size and pitch, that the prior art has failed altogether. Smaller bond pads inherently imply smaller ball bonds—which must be '100% on pad', i.e. the bonded area should, ideally, correspond to the greatest circle inscribable in the square bond pad. A smaller ball bond requires a smaller free air ball. Consequently, in fine-pitch bonding, consistent production of a small free air ball is an absolute necessity.

Free air ball size is usually expressed as BSR—the ratio of the free air ball diameter to that of the wire—and is governed by factors such as the wire composition, diameter and tail shape after the second bond, the EFO conditions and capillary geometry. State-of-the-art BSRs are typically above 2. The industry is trying to bring this down to the 1.4–1.6 range or even lower.

After the second bond, the bent and deformed end of the wire must be totally consumed by the EFO arc. Clearly a smaller tail volume will yield a smaller BSR. Wire tail shape and volume depend on the wire diameter and the capillary's inner chamfer. Hence, a smaller free air ball dictates a smaller chamfer as well as a smaller wire diameter, below the standard 25 µm diameter. However, the diameter of the capillary borehole must be proportionate to the diameter of the wire. If the hole is too tight, wire drag will be too high, and if too large, the looping profile, loop consistency and wire bond positioning are significantly affected.

In summary, to allow further reduction in bond pad pitch, it is imperative that capillaries having smaller tips and boreholes be available. The current prior art is unable to comply with this requirement and IC designers are, therefore, reduced to using the smallest capillaries they can find on the market.

From the explanations provided above, it will have become obvious to anyone skilled in the art, that state-of-the-art semiconductor wire bonding tools, even bottleneck capillaries, constitute the true bottleneck in very high IC integration.

BRIEF SUMMARY OF THE INVENTION

In accordance with the present invention, semiconductor wire bonding tools are micromolded from a mixture of ultrafine particulate materials mixed with an organic binder. Substantially all the organic binder is subsequently extracted from the green bonding tools which are then sintered, upon which they undergo isotropic, constant and accurately predetermined shrinkage. This invention can also be applied towards the fabrication of bonding wire that matches the reduced dimensions of bonding tools made using this invention. Hence, semiconductor wire bonding tools with reduced dimensions unattainable by the prior art, and even in the nanometer range, are rendered possible and can be economically manufactured through the application of this invention.

OBJECTS AND ADVANTAGES

It is a primary object of this invention to overcome the dimensional and design limitations of the prior art by providing a versatile and economic method to fabricate the extremely small tools needed by the microelectronic and semiconductor industries.

It is a further object of this invention to allow the fabrication of micromolds to produce the above extremely small tools for the microelectronic and semiconductor industries.

It is yet another object of this invention to provide a manufacturing process for microwire drawing dies.

Still another object of this invention is to provide a method for higher integration of electronic circuits on microchips by allowing the use of thinner bonding wire and bond pads of reduced size and a smaller bond pad pitch.

BRIEF DESCRIPTION OF THE SEVERAL VIEWS OF THE DRAWINGS

FIG. 4 is a cross-sectional view of a micromold for molding the tip of the present invention wire bonding capillary showing the central core pin to form the capillary bore in a slightly retracted position from the cavity;

FIG. 5 is a cross-sectional view of the micromold of FIG. 4 showing the central core pin to form the capillary bore in the abutted position with reference to the cavity;

FIG. 6 is a sequence of views of progressively smaller micromold combinations, each consisting of a concave (cavity) and a matching convex (capillary tip) configuration.

DESCRIPTION OF THE PREFERRED EMBODIMENTS

Figure 1:
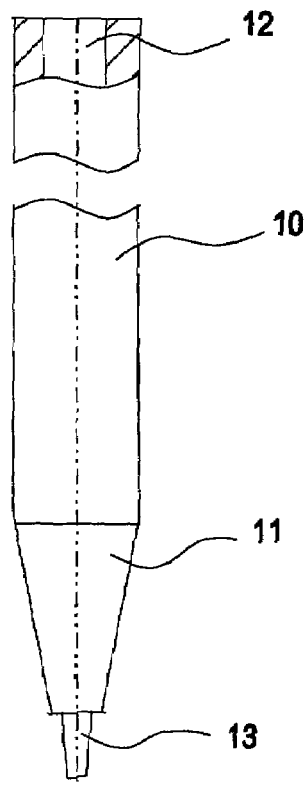
FIG. 1 is a side elevation of a typical prior art bottleneck wire bonding capillary.

Briefly, this invention starts by compounding a thermoplastic compound, consisting of fine particulate matter, and an organic binder.

The discrete phase of the thermoplastic compound is made up of at least one finely divided particulate material, such as a ceramic or a metallic powder, however it is often made up of powders of different ceramic or metallic materials, either in elemental or prealloyed form, or even mixtures of these. The main directives in selecting the type of ingredients for the discrete phase will be the desired composition and geometric resolution of the end product. For instance if a ceramic wire bonding capillary is intended it will generally be advantageous to use a commercially available fine-grained alumina powder although zirconia or mixtures of alumina and zirconia and other ingredients can also be used. When a wire bonding wedge is intended it will generally be advantageous to use a commercially available fine-grained prealloyed cemented carbide powder such as tungsten carbide with cobalt, iron or nickel as a binder although titanium carbide or other carbides or nitrides can also be used. When a prealloyed powder of the desired composition is unavailable or is found unsuitable because of quality or price, various elemental and prealloyed powders may be blended in the proper proportions so that, upon sintering, the desired end composition will be achieved.

The continuous phase of the thermoplastic compound is made up of at least one thermoplastic organic material though generally it will be made up of several different organic constituents which may include polyolefin resins, silicones, waxes, oils, greases and the like. In most cases various organic surface active materials (surfactants), plasticizers and antioxidants will also be included to optimize the characteristics of the particulate materials and to avoid or retard premature oxidative degradation of the organic binder. Usually the binder will be specifically formulated for a given discrete phase to optimize the thermoplastic compound's Theological properties and the thermal decomposition pattern of the organic binder. Anyone skilled in the art will be well aware of the number of combinations and permutations possible at this point to obtain the desired characteristics of the organic binder. Enumerating such possibilities would not materially contribute to the description of this invention. However, a typical formula for the organic binder mixture would be approximately one-third by weight of polyethylene, one-third by weight of paraffin wax, one-third by weight of beeswax with perhaps 0.1 through 0.2 percent of stearic acid and 0.05% of an antioxidant added.

The discrete particulate materials and thermoplastic binder ingredients are mixed together into a homogeneous mass at a temperature in excess of the melting point or flow point of the thermoplastic materials. Techniques for producing thermoplastic compounds are well described in the prior art and will not be elaborated on here.

The organic binder is formulated in such way as to be extractable from the green parts using well-known techniques such as aqueous or organic solvent extraction, oxidative degradation, catalytic decomposition, vacuum distillation, wicking and the like. The binder-free structure is then sintered to its final dense end configuration in accordance with prior art techniques as set forth in Strivens U.S. Pat. No. 2,939,199 and Wiech U.S. Pat. No. 4,197,118.

What is crucial for this invention is that the exact volumetric ratio of discrete phase to that of the thermoplastic compound be established with the greatest possible accuracy so that the shrinkage upon sintering can be determined with great precision in accordance with the teachings of the inventors' related co-pending patent application Ser. No. 09/962,526 entitled: Method For Controlling The Dimensions Of Bodies Made From Sinterable Materials.

Referring now to FIG. 1, the principal parts of a typical wire bonding capillary are shown. These include a cylindrical body portion 10 ending in a conical section 11 and terminating in tip 13. A central borehole 12 through which the bonding wire passes during the bonding process traverses the capillary over its entire length, narrowing in diameter in the conical section 11 to reach the capillary's nominal functional borehole diameter at tip 13.

Figure 2:
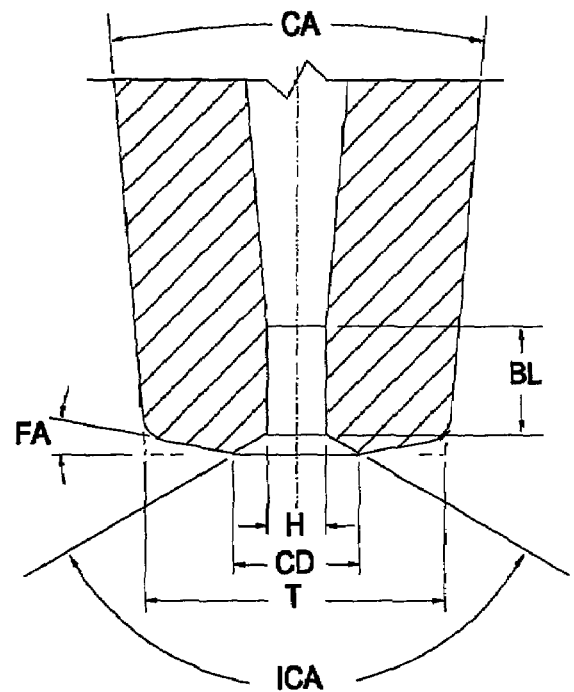
FIG. 2 is an enlarged section in elevation of the tip of the bottleneck wire bonding capillary shown in FIG. 1.

The tip of a semiconductor wire bonding tool is its functional part and incorporates the most critical and finest design features, essential to the success of the bonding process. Referring now to FIG. 2 which depicts a magnified cross-section of a typical wire bonding capillary tip, some of these critical design features of the tip are shown. These include the cone angle (CA), the tip diameter (T) and face angle (FA), the inner chamfer angle (ICA) and diameter (CD), the borehole diameter (H) and the length over which this diameter is maintained constant (BL). It is precisely in the reduction of the dimensions of those critical design features where the prior art has reached an end point.

Figure 3:
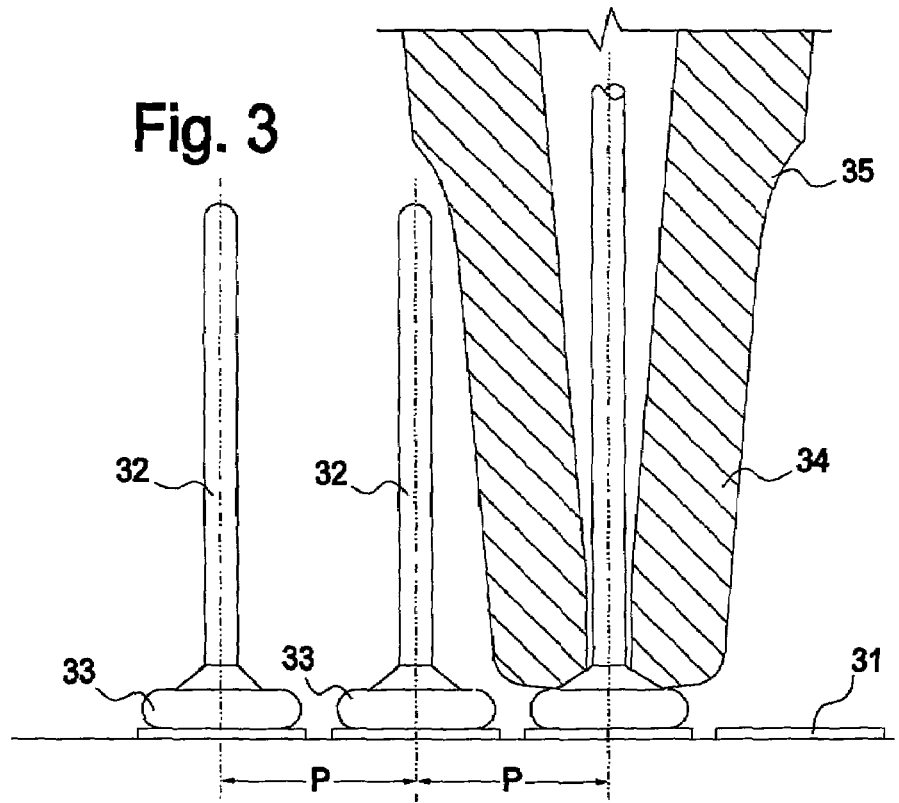
FIG. 3 is an enlarged section in elevation of a typical prior art wire bonding capillary showing the front of a fine pitch bonded wire at the first bond.

The importance of the tip design features are further exemplified in FIG. 3 which shows an enlarged section in elevation of the tip 34 of a typical prior art bottleneck capillary in the process of interconnecting bonding wire 32 onto bonding pad 31 in what is commonly referred to as the first or ball bond 33.

In accordance with this invention, green semiconductor wire bonding tool configurations are shaped by molding the said thermoplastic compound in micromolds fabricated according to the method provided in the present inventors' related U.S. patent application Ser. No. 09/976,393 entitled: Method For Making Micromolds.

Referring now to FIG. 4 a micromold insert 41 to form the capillary tip is shown. The borehole of the capillary is generated via a core pin 42 shown here in a slightly retracted position from the cavity. In FIG. 5 the same micromold is shown but with core pin 51 in the abutted position with the boss 52 of the cavity insert, thus forming the desired cavity configuration 53.

Referring now to FIG. 6 a sequence of views of progressively smaller micromold combinations, each consisting of a concave (cavity) and a matching convex (capillary tip) configuration are shown. For each of these micromold combinations the concave (cavity) and convex (capillary tip) elements are in different states, i.e. either in the green (molded) state or in the dense or sintered state. Also this condition reverses for each successive view. A more detailed explanation will make this clear.

Let us assume capillary tip 61 is in the dense or sintered state although the following description would be equally plausible if we assumed capillary tip 61 to be in the green (molded) state. In the now assumed case where capillary tip 61 is in the dense or sintered state, this element could be the tip of a prior art capillary or the tip of a capillary made according to the present invention. Capillary tip 61 is now used as a mandrel or mold core around which a concave green mold insert 62 is molded. This green insert 62 is subsequently dewaxed and sintered during which it shrinks by an amount which will have been accurately predetermined in accordance with the teachings of the present inventors' U.S. patent application No. 09/962,526 entitled: 'Method For Controlling The Dimensions Of Bodies Made From Sinterable Materials'. Following sintering, green insert 62 will become the sintered mold cavity insert 63 of the next micromold combination. A green capillary tip 64 is now molded in the thus created micromold and this is likewise dewaxed and sintered to become sintered capillary tip 65 which is in turn used as a mandrel or mold core to form a new green micromold cavity insert 66. The process can be repeated in principle indefinitely although, naturally, one would expect there to exist a practical limit to further miniaturization.

From above description it can thus be seen that the present invention allows to fabricate semiconductor wire bonding tools the dimensions of which are reduced well beyond the capabilities of prior art manufacturing techniques.

In the discussion of the specific embodiments of the present invention which now follows, it should be understood that although these specific embodiments are provided mainly with reference to materials such as alumina, (aluminum oxide), zirconia (zirconium oxide) or tungsten carbide, the invention also applies to other metals, ceramics, cermets and alloys and many other sinterable materials.

In a preferred embodiment, a blend of 85 percent by weight of a calcined reactive alpha alumina powder (Al6SG of Alcan) with average particle size of 0.45 μm and 15 percent by weight of an yttrium-stabilized zirconia powder (TZ-3Y of Daiichi Kigenso K.K. Co., Ltd) with an average particle size of 0.3 μm was mixed with a thermoplastic binder composed of one-third by weight of polyethylene, one-third by weight of paraffin wax, one-third by weight of beeswax with 0.2 percent of stearic acid until a homogeneous molding feedstock containing 85 percent by weight of particulate materials was obtained.

The feedstock was molded into the cavity of a micromold having a ceramic capillary configuration and green capillaries were produced. The green capillaries had an internal borehole of about 10 μm in diameter and a bonding tip diameter of about 90 μm, while the shank diameter in the region where the capillary is inserted into the ultrasonic horn was about 1.9 mm. After debinding and sintering the borehole diameter had shrunk to 8 μm, the bonding tip had shrunk to 75 μm. The shank diameter had shrunk to 1.587 mm, which is substantially the standard dimension in the industry.

In another preferred embodiment, a prealloyed tungsten carbide powder containing about 10 percent cobalt as a binder (WC-10Co of Korea Tungsten Co., Ltd) with average particle size of 0.8 μm was mixed with a thermoplastic binder identical to the one used in the above case until a homogeneous molding feedstock containing 92 percent by weight of particulate materials was obtained.

The feedstock was molded into the cavity of a micromold having a bonding wedge configuration and green wedges were produced. The green wedges had an internal borehole of about 18 μm in diameter and a wedge foot width of about 40 μm, while the shank diameter in the region where the bonding edge is inserted into the ultrasonic horn was about 2.187 mm. After debinding and sintering the wedge borehole diameter had shrunk to 13 μm, the wedge foot width had shrunk to 30 μm. The shank diameter had shrunk to 1.585 mm, which is substantially the standard dimension in the industry.

Through the above illustrations it will have become apparent to anyone skilled in the art that this invention allows the fabrication of extremely small wire bonding tools and other items from a great many different materials. In particular, it will have become apparent that the method disclosed in the present application can be easily extended to produce tools and items the dimensions of which are in the nanometer scale. Such items are currently not in great demand in the market but there is great impetus worldwide to develop nanotechnology and this invention provides the means to overcome the many practical difficulties posed by the need for nanoscale parts.

CONCLUSION, RAMIFICATIONS AND SCOPE

In conclusion, the major advantage of this invention resides in the ability to produce extremely small semiconductor wire bonding tools that are not technically or economically possible by prior art forming techniques.

The practical applications of this invention are clearly broad in scope and universal and attempting to enumerate them all would not materially contribute to the description of this invention. In particular, this invention opens the door to a vast array of higher integrated semiconductor products currently not achievable.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method for producing tools or blanks for tools of reduced dimensions for use in the assembly and interconnection of semiconductor chips, comprising:
   a. providing at least one sinterable material in fine particulate form and at least one degradable organic thermoplastic material,
   b. mixing an accurately determined volume of said sinterable particulate material or materials with an accurately determined volume of said thermoplastic material or materials to form a thermoplastic compound,
   c. forming said thermoplastic compound into green semiconductor wire bonding tools or blanks for semiconductor wire bonding tools, and
   d. extracting substantially all of the organic thermoplastic material from said green tools or blanks and sintering the thus obtained organic-free preforms into dense end products of reduced dimensions;
   wherein the action of extracting substantially all of the organic thermoplastic material from said green tools or blanks and sintering the thus obtained organic-free preforms into dense end products of reduced dimensions results in dense end products comprising tools for semiconductor wire bonding that respectively include at least one borehole having final dimensions such that bonding wire for bonding semiconductor wires may pass during bonding, and wherein the action of extracting substantially all of the organic thermoplastic material from said green tools or blanks and sintering the thus obtained organic-free preforms into dense end products of reduced dimensions includes obtaining the final dimensions of the at least one borehole during sintering.

2. The method of claim 1, wherein said sinterable particulate material or materials are selected from the class of metals, ceramics and mixtures of metals and ceramics.

3. The method of claim 1, wherein said degradable organic thermoplastic material or materials are selected from the class of polyolefins, waxes, plasticizers, greases, oils, surfactants and mixtures of these.

4. The method of claim 1, wherein the tools include semiconductor wire bonding capillaries or blanks for semiconductor wire bonding capillaries.

5. The method of claim 1, wherein the tools for semiconductor wire bonding include semiconductor wire bonding capillaries that respectively include at least one borehole having final dimensions such that bonding wire for bonding semiconductor wires may pass during bonding, wherein the final dimensions of the at least one borehole are obtained during sintering.

6. The method of claim 1, wherein the action of extracting substantially all of the organic thermoplastic material from said green tools or blanks and sintering the thus obtained organic-free preforms into dense end products of reduced dimensions results in dense end products comprising tools for semiconductor wire bonding that respectively include at least one borehole having final dimensions including a final diameter such that bonding wire for bonding semiconductor wires may pass during bonding, and wherein the action of extracting substantially all of the organic thermoplastic material from said green tools or blanks and sintering tbe thus obtained organic-free preforms into dense end products of reduced dimensions includes obtaining the final dimensions including the final diameter of the at least one borehole during sintering.

7. The method of claim 6, wherein the action of extracting substantially all of the organic thermoplastic material from said green tools or blanks and sintering the thus obtained organic-free preforms into dense end products of reduced dimensions includes obtaining a final diameter of about 10 micrometers for the at least one borehole during sintering.

8. The method of claim 6, wherein the action of extracting substantially all of the organic thermoplastic material from said green tools or blanks and sintering the thus obtained organic-free preforms into dense end products of reduced dimensions includes obtaining a final diameter of about 13 micrometers for the at least one borehole during sintering.

9. The method of claim 6, wherein the action of extracting substantially all of the organic thermoplastic material from said green tools or blanks and sintering the thus obtained organic-free preforms into dense end products of reduced dimensions includes obtaining a final diameter of about 8 micrometers for the at least one borehole during sintering.

10. A method for producing tools or blanks for tools of reduced dimensions for use in the assembly and interconnection of semiconductor chips, comprising:
    a. providing at least one sinterable material in fine particulate form and at least one degradable organic thermoplastic material,
    b. mixing an accurately determined volume of said sinterable particulate material or materials with an accurately determined volume of said thermoplastic material or materials of form a thermoplastic compound,
    c. forming said thermoplastic compound into green semiconductor wire bonding tools or blanks for semiconductor wire bonding tools, and
    d. extracting substantially all of the organic thermoplastic material from said green tools or blanks and sintering the thus obtained organic-free performs into dense end products of reduced dimensions;
    wherein the action of extracting extracting substantially all of the organic thermoplastic material from said green tools or blanks and sintering the bus obtained organic-free performs into dense end products of reduced dimensions results in dense end products comprising tools for semiconductor wire bonding that respectively include at least one borehole having a final diameter such that bonding wire for bonding semiconductor wires may pass during bonding, and wherein the action of extracting extracting substantially all of the organic thermoplastic material from said green tools or blanks and sintering the thus obtained organic-free performs into dense end products of reduced dimensions includes obtaining the final diameter of the at least one borehole during sintering.

11. The method of claim 10, wherein the said tools include semiconductor wire bonding wedges or blanks for the semiconductor wire bonding wedges.

12. The method of claim 10, wherein the tools for semiconductor wire bonding include semiconductor wire bonding capillaries that respectively includes at least one borehole having a final diameter such that bonding wire for bonding semiconductor wires may pass during bonding, wherein the final diameter of the at least one borehole are obtained during sintering.

13. The method of claim 10, wherein the action of extracting substantially all of the organic thermoplastic material from said green tools or blanks and sintering the thus obtained organic-free preforms into dense end products of reduced dimensions includes obtaining a final diameter of about 10 micrometers for the at least one borehole during sintering.

14. The method of claim 10, wherein the action of extracting substantially all of the organic thermoplastic material from said green tools or blanks and sintering the thus obtained organic-free preforms into dense end products of reduced dimensions includes obtaining a final diameter of about 13 micrometers for the at least one borehole during sintering.

15. The method of claim 10, wherein the action of extracting substantially all of the organic thermoplastic material from said green tools or blanks and sintering the thus obtained organic-free preforms into dense end products of reduced dimensions includes obtaining a final diameter of about 8 micrometers for the at least one borehole during sintering.

* * * * *